United States Patent
Giliyar Radhakrishna et al.

(10) Patent No.: US 12,345,785 B2
(45) Date of Patent: Jul. 1, 2025

(54) METHOD AND APPARATUS FOR PERFORMING ACCELARATED MAGNETIC RESONANCE IMAGING WITH REDUCED OFF-RESONANCE EFFECT

(71) Applicants: COMMISSARIAT A L'ENERGIE ATOMIQUE ET AUX ENERGIES ALTERNATIVES, Paris (FR); SIEMENS HEALTHCARE SAS, Saint Denis (FR)

(72) Inventors: Chaithya Giliyar Radhakrishna, Gif-sur-Yvette (FR); Guillaume Daval Frerot, Gif-sur-Yvette (FR); Alexandre Vignaud, Gif-sur-Yvette (FR); Philippe Ciuciu, Gif-sur-Yvette (FR)

(73) Assignees: COMMISSARIAT A L'ENERGIE ATOMIQUE ET AUX ENERGIES ALTERNATIVES, Paris (FR); SIEMENS HEALTHCARE SAS, Saint Denis (FR)

( * ) Notice: Subject to any disclaimer, the term of this patent is extended or adjusted under 35 U.S.C. 154(b) by 182 days.

(21) Appl. No.: 18/137,840

(22) Filed: Apr. 21, 2023

(65) Prior Publication Data
US 2023/0366961 A1 Nov. 16, 2023

(30) Foreign Application Priority Data
Apr. 21, 2022 (EP) ..................................... 22305592

(51) Int. Cl.
*G01V 3/00* (2006.01)
*G01R 33/385* (2006.01)
(Continued)

(52) U.S. Cl.
CPC ....... *G01R 33/4822* (2013.01); *G01R 33/385* (2013.01); *G01R 33/543* (2013.01); *G01R 33/5616* (2013.01)

(58) Field of Classification Search
CPC .............. G01R 33/5608; G01R 33/385; G01R 33/4824; G01R 33/4828; G01R 33/50; G01R 33/561; A61B 5/4312; A61B 5/004
(Continued)

(56) References Cited

U.S. PATENT DOCUMENTS

2015/0285879 A1* 10/2015 Hilbert ............... G01R 33/5611
324/309

FOREIGN PATENT DOCUMENTS

| CN | 109188326 A | * | 1/2019 | ............. G01R 33/34 |
| WO | 2019/048565 A1 | | 3/2019 | |
| WO | 2020/245018 A1 | | 12/2020 | |

OTHER PUBLICATIONS

Chaithya, et al., "Optimizing Full 3D Sparkling Trajectories for High-Resolution Magnetic Resonance Imaging", IEEE Transactions on Medical Imaging, vol. 41, Issue: 8, pp. 2105-2117, Aug. 2022.

(Continued)

*Primary Examiner* — Walter L Lindsay, Jr.
*Assistant Examiner* — Frederick Wenderoth
(74) *Attorney, Agent, or Firm* — BakerHostetler (57) ABSTRACT

A method of performing magnetic resonance imaging of a body using a magnetic resonance imaging scanner the method includes applying to the body a time-varying magnetic field gradient ($G_x$, $G_y$, $G_z$) defining a continuous trajectory (ST) in k-space complying with a set of constraints including constraints on maximum amplitude and maximum slew rate of the time-varying magnetic field gradient, such that sampling points (KS) belonging to the (Continued)

trajectory define a pseudo-random sampling of the k-space, approximating a predetermined target sampling density, the trajectory in k-space minimizing, subject to the set of constraints, a cost function defined by the difference between a first term, called attraction term, promoting consistency of the distribution of sampling points in k-space with the predetermined target sampling density, and a second term, called repulsion term, promoting separation in k-space between sampling points, the repulsion term being expressed as a sum of contributions corresponding to respective pairs of sampling points; wherein each the contribution is weighted by a weight which increase with temporal separation of the sampling points along the trajectory in k-space.

15 Claims, 6 Drawing Sheets
(1 of 6 Drawing Sheet(s) Filed in Color)

(51) Int. Cl.
    *G01R 33/48*         (2006.01)
    *G01R 33/54*         (2006.01)
    *G01R 33/561*       (2006.01)

(58) Field of Classification Search
    USPC .......................................................... 324/309
    See application file for complete search history.

(56) References Cited

OTHER PUBLICATIONS

Sutton, et al., "Fast, iterative image reconstruction for MRI in the presence of field inhomogeneities", IEEE Trans Med Imaging, vol. 22(2), pp. 178-188, Feb. 2003.

Andersson, et al., "How to correct susceptibility distortions in spin-echo echo-planar images: application to diffusion tensor imaging", NeuroImage, vol. 20(2), pp. 870-888, 2003.

Boyer, et al., "On the generation of sampling schemes for magnetic resonance imaging", SIAM Journal on Imaging Sciences, vol. 9, No. 4, pp. 2039-2072, 2016.

Giliyar Radhakrishna, et al., "Optimizing full 3D Sparkling trajectories for high-resolution T2*-weighted MagneticResonance Imaging", 2020 arXiv preprint arXiv:2108.02991, and IEEE Transactions on Medical Imaging, 2022.

Chauffert, et al., "A projection algorithm for gradient waveforms design in Magnetic Resonance Imaging", IEEE Transactions on Medical Imaging, vol. 35, No. 9, pp. 2026-2039, 2016.

Daval-Frérot, et al., "Off-resonance correction of non-Cartesian SWI using internal field map estimation", International Society for Magnetic Resonance in Medicine, May 2021.

Haldar, "Low-Rank Modeling of Local κ-Space Neighborhoods (LORAKS) for Constrained MRI", IEEE Transactions on Medical Imaging, vol. 33, No. 3, pp. 668-681, 2014.

Lazarus, et al., "Sparkling: Novel Non-Cartesian Sampling Schemes for Accelerated 2D Anatomical Imaging at 7T Using Compressed Sensing", 25th annual meeting of the International Society for Magnetic Resonance Imaging, Apr. 2017.

Lazarus, et al., "Sparkling: variable-density κ-space filling curves for accelerated T 2 * -weighted MRI", Magnetic Resonance in Medicine, Wiley, vol. 81, No. 6, pp. 3643-3661, 2019.

Lustig et al., "Sparse MRI: The application of compressed sensing for rapid MR imaging", Magn Reson Med, vol. 58, pp. 1182-1195, 2007.

Haskell, et al., "Off-resonance artifact correction for MRI: A review", NMR in Biomedicine, vol. 36, No. 5, May 2023.

Chaithya, et al., "More-Sparkling: Non-Cartesian trajectories with Minimized Off-Resonance Effects", ISMRM Annual Meeting, 2022.

Radhakrishna, et al., "Improving spreading projection algorithm for rapid κ-space sampling trajectories through minimized off-resonance effects and gridding of low frequencies", Magn Reson Med., vol. 90, Issue 3, 2023.

\* cited by examiner

METHOD AND APPARATUS FOR PERFORMING ACCELARATED MAGNETIC RESONANCE IMAGING WITH REDUCED OFF-RESONANCE EFFECT

CROSS-REFERENCE TO RELATED APPLICATION

This application claims priority to foreign European patent application No. EP 22305592.2, filed on Apr. 21, 2022, the disclosure of which is incorporated by reference in its entirety.

FIELD OF THE INVENTION

The invention relates to a method and apparatus for performing accelerated magnetic resonance imaging while minimizing the impact of off-resonance effect.

BACKGROUND

Magnetic Resonance Imaging (MRI) is one of the most powerful imaging techniques used in clinical routine today, but remains a lengthy procedure, particularly when the acquisition of large and/or high resolution images, comprising several millions of pixels, is sought. For instance, acquiring a three-dimensional image of a human brain with a field of view of 205×205×52 mm$^3$ and a 200 µm resolution using a T2* sequence at an acceptable signal-to-noise ratio (SNR) of 7.6 may require an acquisition time of about three hours for a short repetition time (TR≅20 ms), which is clearly unacceptable for clinical purposes.

This is because MRI images are obtained by sampling the so-called "k-space" domain, the spatial frequency spectrum of the image, which is related to the physical space by a multidimensional Fourier transform. Sampling theory teaches that the sampling frequency should be at least twice the highest frequency contained in the signal to be sampled (which, in the case of MRI, is the multidimensional Fourier transform of the body to be imaged), otherwise aliasing artifacts will appear; this is known as the Nyquist, or Nyquist-Shannon, criterion. As a consequence, using conventional acquisition schemes, the number of k-space samples must be at least equal to the number of pixels of the image to be reconstructed. Moreover, SNR requirements impose a minimum acquisition time for each sample.

Several techniques have been developed in order to reduce the acquisition time while avoiding artifact ("accelerated MRI").

Some of these techniques, such as Simultaneous Multi-slice imaging (SMS) and parallel MRI involve the use of specialized hardware comprising multiple receiver coils for acquiring magnetic resonance signals. Their implementation is therefore expensive. Moreover, they provide a limited acceleration, because image quality drops fast with the acceleration factor. Even using both techniques simultaneously, the combined acceleration factor does not exceed 8 in practice.

Other techniques are compatible with the use of a single receiving coil (even though the use of multiple coils is also possible), like Partial Fourier imaging, which exploits redundancies in k-space information, non-Cartesian k-space filling such as radial or spiral and Compressed Sensing (CS). While Partial Fourier techniques only offer very limited acceleration factors (typically lower than two), Compressed Sensing allows order-of-magnitude higher acceleration rates especially while imaging with high matrix size (either high resolution and small field of view or low resolution and large field of view), see [Halder, 2014].

A review of CS MRI can be found in [Lustig et al, 2008].
Compressed Sensing techniques rely on three principles:

The image to be reconstructed must admit a sparse (or compressible) representation. Said differently, it must be possible to decompose it on a predetermined basis (e.g. a wavelet basis) such that only a small fraction of the decomposition coefficients is non-zero for strict sparsity or significantly greater than zero for compressibility. Typically, in the case of a noisy signal, a coefficient is considered significantly greater than zero if its absolute value is at least equal to the noise standard deviation. Alternatively, only a predetermined fraction of the coefficients—those having the greatest absolute value—may be kept. For instance, only the top 1% of the coefficient may be kept, resulting in a compression factor of 100.

Reconstruction must be performed using a nonlinear method promoting sparsity of the image representation, as well as consistency with the acquired samples.

The k-space must be under-sampled in a incoherent manner, in order to accelerate the acquisition. Incoherent sampling is usually achieve using a pseudo-random under-sampled pattern. The under-sampling reduces the number of signal acquisitions, and therefore provides the required acceleration, while pseudo-randomness ensures that, in the sparsifying representation, subsampling artifacts are incoherent, i.e. decorrelated or noise-like. This incoherence property is extremely important and measures the degree of correlation between any pair of elements taken in the sparsifying (e.g., wavelets) and sensing (e.g., Fourier in CS-MRI) bases.

Compressed sensing often uses non-Cartesian pseudo-random sampling of k-space since this strategy provides better incoherence (lower correlation between samples). Preferably, the pseudo-random sampling is non-uniform, its density matching the energy distribution of the image to be acquired in the k-space. In clinical application, this usually means using a variable density sampling which is denser near the center of the k-space (low spatial frequencies) and radially decreases towards the periphery of k-space, namely high spatial frequencies.

From a purely theoretical point of view, the pseudo-random sampling could be obtained by drawing sampling points following a predefined probability distribution, corresponding to the required sampling density. But in practice, the short lifespan of MR Signals require samples to be acquired through segmented acquisitions along smooth trajectories which are defined by a time-varying magnetic field gradient applied to the body to be imaged after the excitation of its nuclear spins by a radio-frequency (RF) pulse.

Let $\vec{G}$ represent the magnetic field gradient applied to the body to be imaged. This magnetic field gradient defines a trajectory in the k-space which is expressed by:

$$\vec{k(t)} = \gamma \cdot \int_0^t \vec{G(\tau)} \, d\tau \qquad (1)$$

Sampling is performed by acquiring the nuclear magnetic resonance (NMR) signal generated by excited nuclear spins at predetermined times, which correspond to points along said trajectory.

Both the gradient field amplitude $\|\vec{G(t)}\|$ and its slew rate cannot exceed respective limits Gmax and Smax, due to both hardware and, for clinical applications, physiological constraints. Therefore, only sufficiently regular trajectories are allowed.

These trajectories may be bi-dimensional in 2D MRI, when only nuclear spins within a thick slice of the body are excited, on three-dimensional in 3D MRI techniques, where the excitation concerns the whole body or a thick slab thereof. The interest of 3D imaging lies in a higher signal to noise ratio which allows for isotropic high resolution imaging. In the following, for the sake of simplicity, only the case of 2D trajectories will be considered; the invention, however, also applies to 3D and even 4D (i.e. dynamic) MRI.

An important feature of MRI is that the NMR signal decays exponentially after the application of the exciting RF pulse, and typically vanishes. This limits the duration of signal acquisition, and therefore the length of each individual k-space trajectory. As a consequence, several excitation RF pulses, each followed by NMR signal acquisition along a respective elementary trajectory (or "shot"), are required to perform a full k-space sampling. The repetition time TR of these excitation RF pulses—which imposes an upper limit on the duration of the signal acquisition—also depends on the used imaging technique, and in particular on the type of contrast which is sought (T1, T2, T2* . . . ).

Commonly used k-space trajectories are parallel lines (leading to Cartesian sampling), spokes (straight lines radially diverging from the center of the k-space), rosettes, uniform- and variable-density spirals. All of them have been applied to Compressed Sensing, for instance by performing only a limited number of signal acquisitions over a Cartesian grid or by randomly sampling spokes, spirals or rosettes.

Better results, however, are achieved by using "non-parametric" trajectories that provide larger incoherence.

In particular, the so-called SPARKLING ("Spreading Projection Algorithm for Rapid K-space sampLING") technique ([Boyer et al, 2016], [Lazarus et al. 2017], [Lazarus et al. 2019], [Chaithya et al. 2022], WO2019/048565) is based on the projection of a predetermined, usually non-uniform, target sampling distribution onto the set of "admissible" 2D or 3D curves, i.e. to all the curves representing trajectories obtainable without exceeding the limits on the values of the magnetic field gradient and the corresponding slew rate.

The present inventors have realized, however, that non-Cartesian MRI sampling schemes are much more prone to off-resonance artifacts, due to $B_0$ (static "longitudinal" magnetic field) inhomogeneities, than conventional Cartesian ones. The reason is that off-resonance artifacts appear along the readout dimension, which is unidimensional (resp., multidimensional) in Cartesian sampling (resp., non-Cartesian sampling). Hence, $B_0$ inhomogeneities are mixed along multiple dimensions in non-Cartesian sampling which makes them more challenging to counteract. The correction of said artifacts is also much more computationally intensive as it relies a sequence of non-uniform Fast Fourier transforms to model the forward operator.

Indeed, in Cartesian acquisition schemes, off-resonance artifacts only occur along a single axis/dimension in the k-space and often with locally regular patterns. This results in reduced impact on images, and also this property can be exploited in dynamic imaging to revert part of the deformations using [Andersson et al. 2003]. This is not the case for non-Cartesian acquisition schemes such as SPARKLING, wherein two or three magnetic gradients are played at the same time, leading to off-resonance effects impacting all the k-space dimensions/axes and consequently degrading the whole image. In this setting, the conventional way to handle these artifacts consists in acquiring a $B_0$ field map through an external additional scan and then in taking $B_0$ inhomogeneities ($\Delta B_0$) into account during the MRI reconstruction step ([Sutton 2003], [Daval-Frerot et al. 2021]). Although simple from a data acquisition perspective, this approach is computationally expensive as the cost of the artifact correction is embedded within MR image reconstruction and may increase by a 15-fold factor.

SUMMARY OF THE INVENTION

The invention aims at overcoming, in full or in part, the above-mentioned drawback of the prior art. More particularly, it aims at providing a method of accelerated MRI using non-Cartesian k-space sampling and showing reduced sensitivity to off-resonance artifacts without the need for complex and computationally costly corrections.

According to the invention, this aim is achieved by modifying SPARKLING trajectories by introducing a temporal weighting in the k-space to enforce temporally smooth sampling of k-space. This approach will be called MORE-SPARKLING as it stands for Minimal Off Resonance Effects (MORE) SPARKLING.

An object of the invention is then a method of performing magnetic resonance imaging of a body using a magnetic resonance imaging scanner comprising a scanner bore, a primary coil, radio frequency coils, gradient coils) and a signal-processing unit, the method comprising the steps of:
  a. positioning the body in a scanner bore where a static and substantially uniform magnetic field, called longitudinal field, oriented along a direction, called longitudinal direction, is established by the primary coil;
  b. using all or part of the radio-frequency coils to transmit to said body at least one radio-frequency pulse adapted to excite nuclear spins inside said body;
  c. after said or each said radio-frequency pulse, using the gradient coils to apply to said body a time-varying magnetic field gradient defining a trajectory in k-space and simultaneously using all or part of the radio-frequency coils to acquire samples of a magnetic resonance signal emitted by the excited nuclear spin, each sample corresponding to a point (KS) of the k-space belonging to said trajectory; and
  d. using the signal processing unit) to apply a nonlinear reconstruction algorithm to the acquired samples to reconstruct a magnetic resonance image of said body;
    wherein said trajectory in k-space is a continuous trajectory complying with a set of constraints including constraints on maximum amplitude and maximum slew rate of said time-varying magnetic field gradient, such that the points of the k-space corresponding to the samples, called sampling points, define a pseudo-random sampling of the k-space, matching a predetermined target sampling density, said trajectory in k-space minimizing, subject to said set of constraints, a cost function defined by the difference between a first term, called attraction term, promoting consistency of the distribution of sampling points in k-space with said predetermined target sampling density, and a second term, called repulsion term, promoting separation in k-space between sampling points, said repulsion term being expressed as a sum of contributions corresponding to respective pairs of sampling points;
    characterized in that each said contribution is weighted by a weight which increase with temporal separation of the sampling points along said trajectory in k-space.

Another object of the invention is a computer-implemented method of computing a trajectory in k-space to be used for sample acquisition in magnetic resonance imaging, the method comprising the steps of:

i. determining, or receiving from a user input, a number $N_c \geq 1$ of shots constituting the trajectory and a number $N_s > 1$ of sampling points along each said shot;
ii. determining, or receiving from a user input, a predetermined target sampling density;
iii. determining, or receiving from a user input, a set of constraints including constraints on amplitudes of discrete time derivatives of the trajectory;
iv. computing said trajectory by minimizing, subject to said set of constraints, a cost function defined by the difference between a first term, called attraction term, promoting consistency of the distribution of sampling points in k-space with said predetermined target sampling density, and a second term, called repulsion term, promoting separation in k-space between sampling points, said repulsion term being expressed as a sum of contributions corresponding to respective pairs of sampling points;
   characterized in that each said contribution is weighted by a weight which increases with temporal separation of the sampling points along said trajectory in k-space.

Another object of the invention is a computer program comprising instructions which, when the program is executed by a computer, cause the computer to carry out said method of computing a trajectory in k-space to be used for sample acquisition in magnetic resonance imaging.

Yet another object of the invention is a set of driving signals for gradient coils of a magnetic resonance imaging scanner which, when applied to said gradient coils, drive them to generate a time-varying magnetic field gradient defining a trajectory in k-space passing through a plurality of points called sampling points defining a pseudo-random sampling of the k-space, matching a predetermined target sampling density; wherein said trajectory:

is continuous and complies with a set of constraints including constraints on maximum amplitude and maximum slew rate of said time-varying magnetic field gradient;
minimizes, subject to said set of constraints, a cost function defined by the difference between a first term, called attraction term, promoting consistency of the distribution of sampling points in k-space with said predetermined target sampling density, and a second term, called repulsion term, promoting separation in k-space between sampling points, said repulsion term being expressed as a sum of contributions corresponding to respective pairs of sampling points;
characterized in that each said contribution is weighted by a weight which increases with temporal separation of the sampling points along said trajectory in k-space.

A further object of the invention is a magnetic resonance imaging scanner comprising:

a scanner bore inside which a body can be positioned;
a primary coil configured to establish in the scanner bore a static and substantially uniform magnetic field, called longitudinal field, oriented along a direction, called longitudinal direction;
radio frequency coils configured to transmit to said body at least one radio-frequency pulse adapted for exciting nuclear spins inside said body and to acquire samples of a magnetic resonance signal emitted by the excited nuclear spin;
gradient coils configured to apply to said body a time-varying magnetic field gradient defining a trajectory in k-space;
a signal processing unit to apply a nonlinear reconstruction algorithm to the acquired samples of the magnetic resonance signal for reconstructing a magnetic resonance image of said body; and
a controller configured to generate driving signals for the radio frequency coils and for the gradient coils;
wherein the controller is configured to generate said driving signals for for the gradient coils to generate a said time-varying magnetic field gradient such that said a trajectory in k-space passes through a plurality of points called sampling points defining a pseudo-random sampling of the k-space, matching a predetermined target sampling density, said trajectory being continuous and compliant with a set of constraints including constraints on maximum amplitude and maximum slew rate of said time-varying magnetic field gradient, said trajectory in k-space also minimizing, subject to said set of constraints, a cost function defined by the difference between a first term, called attraction term, promoting consistency of the distribution of sampling points in k-space with said predetermined target sampling density, and a second term, called repulsion term, promoting separation in k-space between sampling points, said repulsion term being expressed as a sum of contributions corresponding to respective pairs of sampling points;
and wherein the controller is also configured to generate driving signals for the radio frequency coils such that they acquire said samples of a magnetic resonance signal emitted by the excited nuclear spin in correspondence to the sampling points of the trajectory in k-space;
characterized in that each said contribution to the repulsion term of the cost function is weighted by a weight which increase with temporal separation of the sampling points along said trajectory in k-space.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Additional features and advantages of the present invention will become apparent from the subsequent description, taken in conjunction with the accompanying drawings, which show.

DETAILED DESCRIPTION

Figure 1:
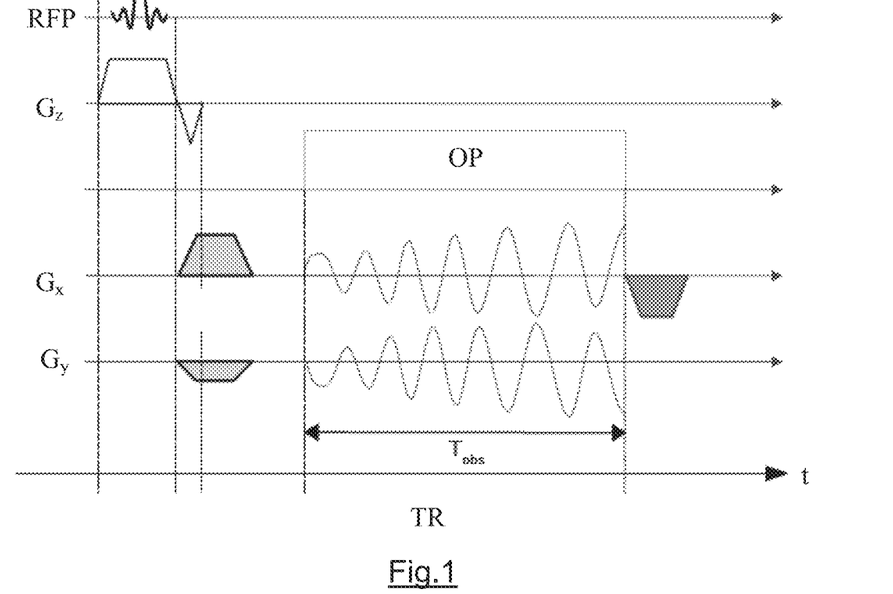
FIG. 1, the chronogram of a modified GRE (Gradient Recalled Echo) pulse sequence to play implementing a "SPARKLING" trajectory according to the prior art or a "MORE SPARKLING" trajectory according to an embodiment of the invention.

FIG. 1 shows the chronogram of a pulse sequence—more particularly a Gradient Recalled Echo (GRE) sequence for T2* weighted anatomical imaging suitable for implementing either a SPARKLING k-space trajectory according to the prior art or a MORE-SPARKLING one.

It is supposed that a body to be imaged (e.g. the head of a patient) is immerged in a static and homogeneous magnetic field $B_0$ oriented along a "longitudinal" direction z. This magnetic field induces a partial alignment of the spins of the atomic nuclei of the body. The aligned nuclear spins may be excited (i.e. flipped) by a radio-frequency pulse RFP at a suitable frequency (Larmor frequency), depending on the values of the magnetic field $B_0$ and of the magnetic momentum of the nuclei. In 2D sequences, as the one illustrated on the figure, a magnetic field gradient $G_z$—i.e. a magnetic field oriented along the z direction, whose magnitude varies linearly along this same direction—is also applied. This has the effect of making the Larmor frequency variable along z; as a consequence, only the nuclear spins within a thin slice of the body are resonant with the RF pulse and can be excited. As known in the art of MRI, this "slice selection" gradient pulse is followed by a short negative blip of the $G_z$ magnetic field gradient ("refocusing gradient") which compensates for a dispersion of the nuclear spin orientations in the xy plane, perpendicular to the z direction.

Due to the use of a slice selection gradient $G_z$, only a 2D image of the selected slice of the body is acquired, which requires sampling of a 2D $k_x k_y$ plane of the k-space; in the following, the expression "k-space" will be used to designate both the three-dimensional $k_x k_y k_z$ space and a two-dimensional plane within it. In alternative embodiments, no slice selection gradient is used, and a domain of the 3D $k_x k_y k_z$ space will have to be sampled.

A trajectory in the k-space (more precisely, in the 2D $k_x k_y$ plane) is defined by playing $G_x$ and $G_y$ gradients after the end of the RF excitation pulse. It is important to underline that the applied magnetic field is always oriented along the z direction, but its magnitude shows linear variations along the x and y directions. First of all, $G_x$ and $G_y$ pulses are applied to reach a suitable point on the boundary of the region of the $k_x k_y$ plane to be sampled. Then "arbitrary" $G_x$ and $G_y$ waveforms are played, defining a winding trajectory with an overall radial orientation, directed toward the center of the $k_x k_y$ plane.

In "3D" implementations without slice selection gradient, a $G_z$ waveform similar to $G_x$ and $G_y$ will be applied to reach a suitable point of the boundary of the 3D domain in the $k_x k_y k_z$ space and to define a three-dimensional trajectory in k-space.

While the gradient waveforms are played, samples of the NMR signal emitted by the excited nuclei are acquired by one or more radio-frequency coils connected to a suitable acquisition circuit including an analog-to-digital (ADC) converter. The acquisition period, whose duration $T_{obs}$ is limited by the decay of the NMR signal, is designated by reference OP on FIG. 1. After the end of the acquisition period, a final $G_x$ gradient pulse ("spoiling gradient") is applied to cancel residual transversal magnetization. The repetition time TR corresponds to the interval beginning just before the radio-frequency pulse RFP and ending at the end of the spoiling gradient pulse.

Figure 2:
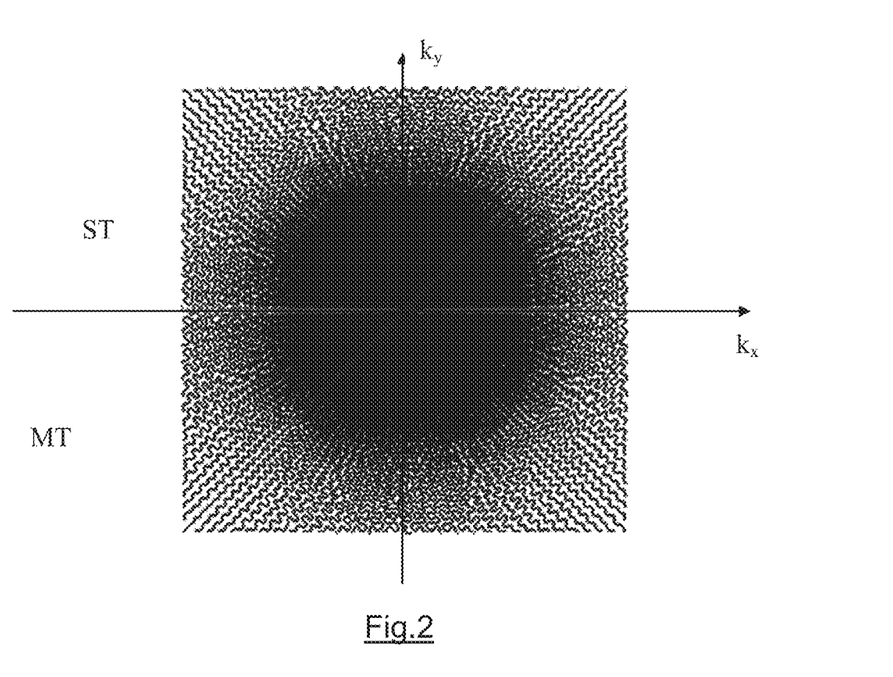
FIG. 2, an exemplary 2D "SPARKLING" trajectory according to the prior art.

This sequence is repeated several times with different gradient waveforms defining respective k-space trajectories which, together, provide the required k-space sampling. The ensemble constituted by an excitation RF pulse and the associated gradient waveforms is called a "shot"; each shot corresponds to an elementary trajectory. FIG. 2 shows a 2D "multishot" SPARKLING trajectory MT comprising $N_c$=60 radially-oriented elementary trajectories or shots ST, inhomogeneously sampling the $k_x k_y$ plane.

In practice, the magnetic field gradients undergo stepwise changes at discrete time-points separated by intervals of duration $\Delta t$ ("gradient raster time"). Sampling is also performed at regular intervals of duration dt ("ADC dwell time"). The ADC dwell time dt is preferably lower than, or at most equal to, the gradient raster tile (dt≤$\Delta t$) so as to allow collecting several samples between two consecutive gradient steps. At the same time, reducing the ADC dwell time beyond a certain limit decreases the SNR to an unacceptable level. Therefore, for each specific embodiment of the invention there is an optimal value for dt which can be found.

Let $k_i(1)$ the position, in the k-space, of the starting point of the trajectory associated to the $i^{th}$ shot. A first sample of the NMR signal is acquired in correspondence to this point. The other sampling points correspond to k-space positions given by:

$$k_i(m) = k_i(1) + \gamma \left( \sum_{j=1}^{q} G_i(j) * \Delta t + G_i(q+1) * r \right) \quad (2)$$

where m∈[2: M] is an integer index, M being the overall number of samples acquired along the trajectory, and q and are respectively the modulus and the rest of the Euclidean division of the acquisition time by:

$$t_{ADC,m} = (m-1)*dt = q*\Delta t + r \quad (3)$$

If dt=$\Delta t$, then r=0 and the number of ADC samples matches the number of gradient time steps. If dt<$\Delta t$, then the number of ADC samples is larger than the number of gradient time steps.

"SPARKLING" relies on an optimization-based method that consists of projecting a target sampling distribution over a set of discrete pushforward measures, in particular supported by smooth trajectories [Lazarus et al, 2017; Boyer et al, 2016]. Mathematically, this problem can be cast as a non-convex variational optimization problem under possibly non-convex constraints [Boyer et al, 2016]. The constraints are typical expressed by maximal acceptable values for the gradient amplitude and slew rate, but additional affine constraints may also be used—e.g. imposing that the trajectory passes through a particular point of the k-space at a defined time point (e.g, for echo time definition).

According to ([Boyer et al, 2016], [Lazarus et al. 2017], [Lazarus et al. 2019] and [Chaithya et al. 2022], a SPARKLING trajectory is computed by minimizing, subject to a set of constraints, a cost function defined by the difference between two terms: an "attraction term", which promotes consistency of the distribution of sampling points in k-space with a predetermined (usually non-uniform) target sampling density (TSD), $\Pi$, and a "repulsion term", promoting separation in k-space between sampling points. This can be written as:

$$\hat{K} = \underset{K \in Q^{Nc}}{\mathrm{argmin}} F_p(K, \Pi) = F_p^a(K, \Pi) - F_p^r(K) \qquad (4)$$

Where $$F_p^a(K, \Pi) = \underset{K \in Q^{Nc}}{\mathrm{argmin}} \frac{1}{p} \sum_{i=1}^{p} \int_\Omega \|x - K[i]\Pi(x)dx\| \qquad (5)$$

is the attraction term which ensures the sampling patterns K matches the prescribed TSD $\Pi$, $$F_p^r(K) = \frac{1}{2p^2} \sum_{1 \le i,j \le p} \|K[i] - K[j]\| \qquad (6)$$

is the repulsion term and:
- K is a two or three dimensional vector representing the coordinates of a sampling point in k-space;
- $p = N_c \cdot N_s$ is the number of sampling points along the trajectory, $N_c \ge 1$ being the number of shots, or elementary trajectories, constituting the whole trajectory and $N_s > 1$ the number of sampling points of each shot;
- $Q^{Nc}$ is a set of curves in k-space comprising $N_c$ shots, or segments, each comprising $N_s$ points and complying with the constraints;
- $\Omega$ is a sampling region in k-space, normalized to $[-1, 1]^3$ (for 3D trajectories);
- x represents a generic point of the sampling region $\Omega$;
- $\|\cdot\|$ is a norm, preferably the $L_2$ norm.

The set of constraints can be defined as follows $$\begin{cases} A \circ K = V \\ \forall i = 1 \ldots N_c, k_i \in \Omega^{N_s} \\ \|k_i\|_\infty \le 1, \|\dot{k}_i\|_{2,\infty} \le \alpha, \|\ddot{k}_i\|_{2,\infty} \le \beta \end{cases} \qquad (7)$$

where:
$A \in \mathbb{R}^{Nc \times Ns \times 3}$; $V \in \mathbb{R}^{Nc \times Ns \times 3}$
$A \circ K$ is the Hadamard product between A and K;
$A \circ K = V$ models linear constraints on the trajectories, for instance the Echo Time constraint, which ensure that teach elementary trajectory (shot) passes through the center of the k-space at the echo time TE (see [Chauffert et al. 2016]);
$\dot{k}_i, \ddot{k}_i$ are, respectively, the first and second time derivative of the trajectory in k-space;
For an arbitrary three-dimensional vector c, $$\|c\|_{2,\infty} = \underset{0 \le n \le Ns-1}{\sup} \sqrt{|c_x[n]|^2 + |c_y[n]|^2 + |c_z[n]|^2};$$

$\alpha, \beta$ are normalized parameters expressing hardware constraints on gradient amplitude and gradient slew rate; and
$\Omega^{N_s}$ represents Ns points in $\Omega$.

Usually, the trajectory design process starts with an initialization trajectory, formed e.g. by $N_c$ radial spokes, then the optimization problem (4) is solved under constraints (7) by the projected gradient descent algorithm, as discussed in [Chaithya et al. 2020].

In practice, the optimization is performed through multi-resolution iterations which start by spreading $N_{R^{max}} = p/2^{R^{max}}$ samples at a maximum decimation level $R^{max}$ (e.g. $R^{max} = 5$, i.e. only one in $2^{R^{max}} = 2^5 = 32$ samples is considered) and iterates through a decreasing dyadic process, i.e. $R^{max} = 5$ ($N_0 = p/32$) to $R = 0$ ($N_{final} = p$). This is performed to ensure that the optimization is carried out with faster convergence when the k-space trajectory is optimized coarsely first, ($R = R^{max}$) and is then progressively refined a convergence is approached ($R = 0$, meaning no decimation).

Figure 3:
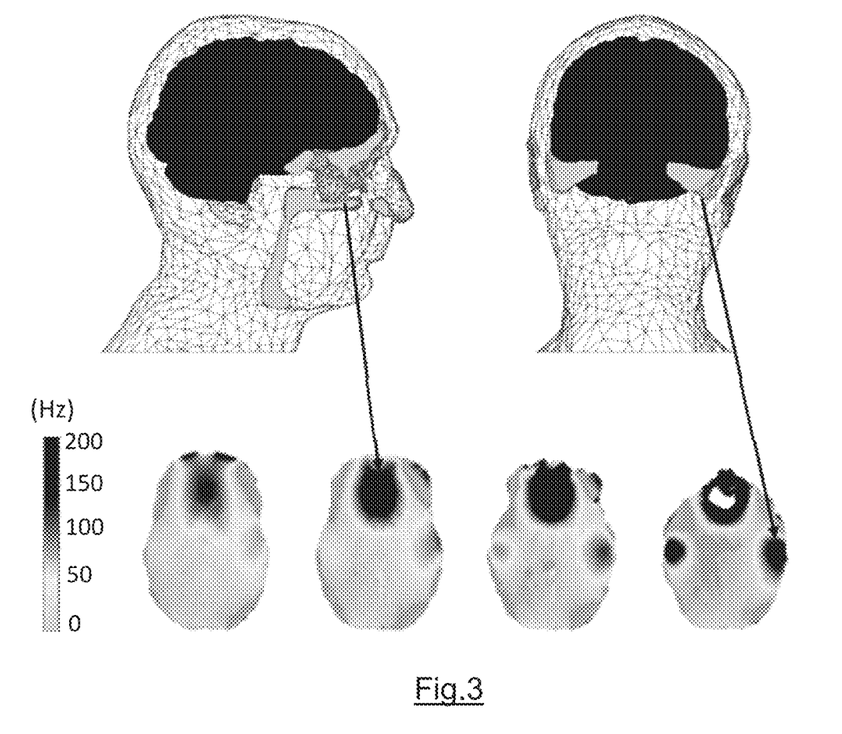
FIG. 3, an exemplary $\Delta B_0$ map of human brain.

Ideally, for MRI—whatever the sampling strategy of the k-space—the longitudinal magnetic field Bo should be as uniform as possible, and the primary coil of a MRI scanner, responsible for generating this field, is specifically designed to this aim. The body to be imaged, however, is inhomogeneous, and its non-uniform magnetic susceptibility in turns induces spatial inhomogeneities $\Delta B_0$ of the magnetic field $B_0$. In the case of a human or animal body, these inhomogeneities are particularly strong in the vicinity of air-filled cavities. This is illustrated on FIG. 3 for the case of a human head, where paranasal sinuses are mainly responsible for magnetic field inhomogeneities in the brain.

Ideally, for a perfectly homogeneous $B_0$ field, the MRI signal s at time t is given by $$s(t) = \int f(r) e^{-i2\pi(k(t) \cdot r)} dr \qquad (8)$$

where f(r) is the spatial distribution of the sample magnetization (r representing position) and k(t) is the sampling trajectory in k-space. Equation (8) is inverted to reconstruct f(r) from s(t). When spatial inhomogeneities $\Delta B_0$ of the magnetic field $B_0$ are taken into account, (8) becomes $$s(t) = \int f(r) e^{-i\omega(r)t} e^{-i2\pi(k(t) \cdot r)} dr \qquad (9)$$

where $\omega(r) = \gamma \Delta B_0(r)$ ($\gamma$ being the gyromagnetic ratio) is the position-dependent variation of the Larmor frequency due to the magnetic field inhomogeneity. If the additional term $e^{-i\omega(r)t}$ is not taken into account (which requires the knowledge of $\Delta B_0(r)$ and is computationally costly and/or requires an additional acquisition which would make the overall SPARKLING not competitive at acquisition), it introduces artifacts in the reconstructed image. These artifacts also depend on the sampling trajectory in k-space k(r).

Figure 4:
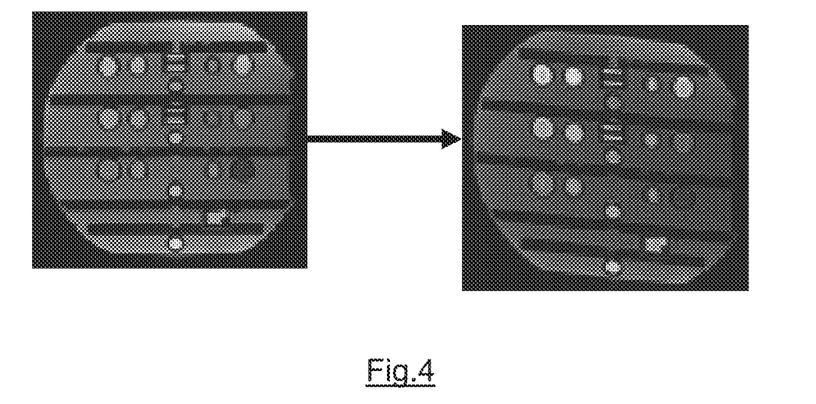
FIG. 4 illustrates off-resonance artifacts in MRI image reconstruction in the case of Cartesian k-space sampling according to the prior art.

FIG. 4 shows the impact of $\Delta B_0(r)$ on a test pattern (left panel: test pattern; right panel: reconstructed image) when a Cartesian line-by-line sampling trajectory in k-space is used. It can be seen that almost no information is lost, even if the patter is slightly deformed.

Figure 5:
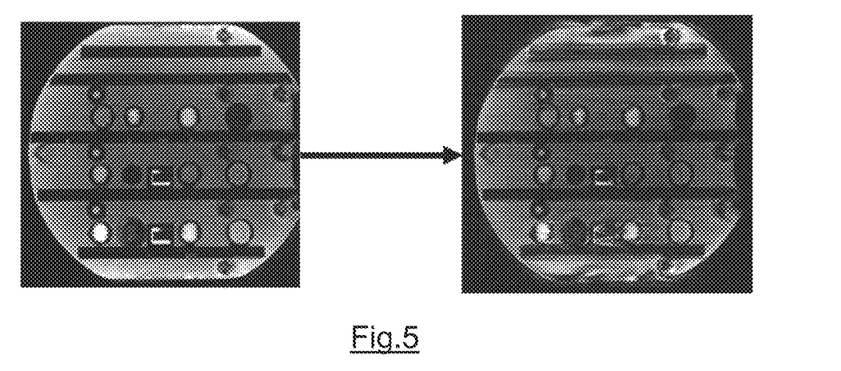
FIG. 5 illustrates off-resonance artifacts in MRI image reconstruction in the case of SPARKLING k-space sampling according to the prior art.

FIG. 5 shows the impact of $\Delta B_0(r)$ on a test pattern of FIG. 4 (left panel) when a 2D SPARKLING sampling trajectory in k-space is used. As it can be seen in the right panel of the figure, details are lost, spurious ones are created and in some regions a substantial loss of signal is even observed. These artifacts are much more detrimental than the simple geometrical distortion observed with Cartesian sampling.

The inventors have realized that this detrimental effect is partly because SPARKLING samples the k-space in a temporally inhomogeneous way. Otherwise stated, nearby locations of the k-space may be sampled at very different times, for instance at the beginning and at the end of the trajectory. This is important because the signal amplitude varies during the acquisition time due to $T_2$ decay. When this decay is taken into account, equation (9) becomes $$s(t) = \int f(r) e^{-(\alpha(r) + i\omega(r))t} e^{-i2\pi(k(t) \cdot r)} dr \qquad (10)$$

where α(r) is the inverse of the (spatially dependent) $T_2$ decay time constant. With this, having k-space samples of s(t) taken in the same region of k-space in a temporally inhomogeneous way would result in varying values of s(t) for the same region of k-space. During reconstruction, these values are averaged out resulting in amplification of the off-resonance artifacts.

To reduce the impact of the off-resonance artifacts on image reconstruction, the present invention propose to modify the SPARKLING trajectories to make them temporally homogeneous—i.e. to ensure that regions of the k-space that are close to each other are sampled at close times—while keeping their significant advantages in terms of acceleration of the signal acquisition. More particularly, this is achieved by modifying the expression of the repulsion term of the cost function (equation (6)) by the introduction of a weighting function which is a growing function of the temporal separation between sampling points. The repulsion term becomes then $$F_p^r(K) = \frac{1}{2p^2} \sum_{1 \le i,j \le p} W(|t_i - t_j|) \|K[i] - K[j]\| \quad (11)$$

where $t_i$, $t_j$ are the times at which two sampling points of a same shot, identified by integer indices i and j, are reached; and W is a monotonously increasing function of $|t_i - t_j|$, preferably of value greater than one, expressing said weight.

In a first embodiment of the invention, $W(|t_i - t_j|)$ is an exponential function:

$$W(|t_i - t_j|) = \exp\left(\frac{|t_i - t_j|\tau}{p}\right) \quad (12)$$

with $\tau \ge 0$ is a scalar repulsion weighting parameter. It is important to note that an excessively strong temporal weighting of the repulsion (i.e. too large a value of $\tau$) results in k-space holes, which is not desirable for good reconstructed image quality. To prevent this, $\tau$ needs to be grid-searched appropriately to enforce temporally smooth k-space sampling, while avoiding undesirable k-space holes. This is done by obtaining SPARKLING trajectories for varying values of and by choosing the value which is optimal with respect to robustness to off-resonance effects, while not having k-space holes which leads to poorer reconstruction performance.

Figure 6:
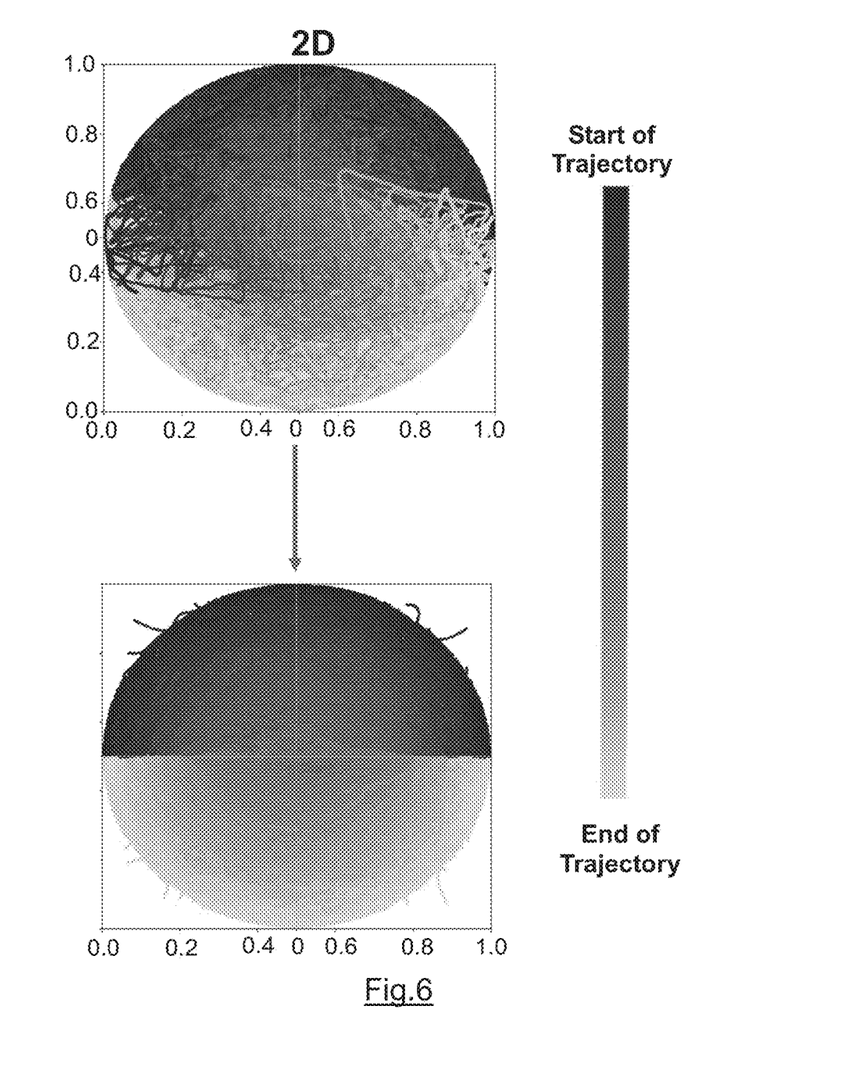
FIG. 6 compares a 3D SPARKLING k-space trajectory, according to the prior art (upper panel) to a 3D MORE- SPARKLING trajectory according to an embodiment of the invention (lower panel), showing the impact of temporal weighting.

The impact of the temporal weighting on a k-space trajectory is illustrated on FIG. 6, where the shade of gray represent the time at which a specific point of k-space is "visited" by a trajectory. The upper panel represent a 3D SPARKLING trajectory according to the prior art; the temporal inhomogeneity is clearly apparent in the form of strong density contrasts. The lower panel of the figure represents a 3D SPARKLING trajectory according to an embodiment of the invention. It can be seen that the grey level varies smoothly, except on an "equatorial" plane.

In a second, and preferred, embodiment of the invention, $$W(|t_i - t_j|) = \exp\left(\frac{|t_i - t_j|\tau}{2^{R^{\max} - R}}\right) \quad (13)$$

The purpose of the weighting $$\frac{1}{2^{R^{\max} - R}}$$

is to shape the amount of temporal repulsion added as a function of the current decimation level, in such a way that the temporal repulsion is stronger at the initial stages of the algorithm and is then substantially reduced near convergence, at finer resolution levels (lower R), in order to prevent the appearance of unwanted k-space holes. Other expressions for W achieving the same result can be envisioned.

Figure 7:
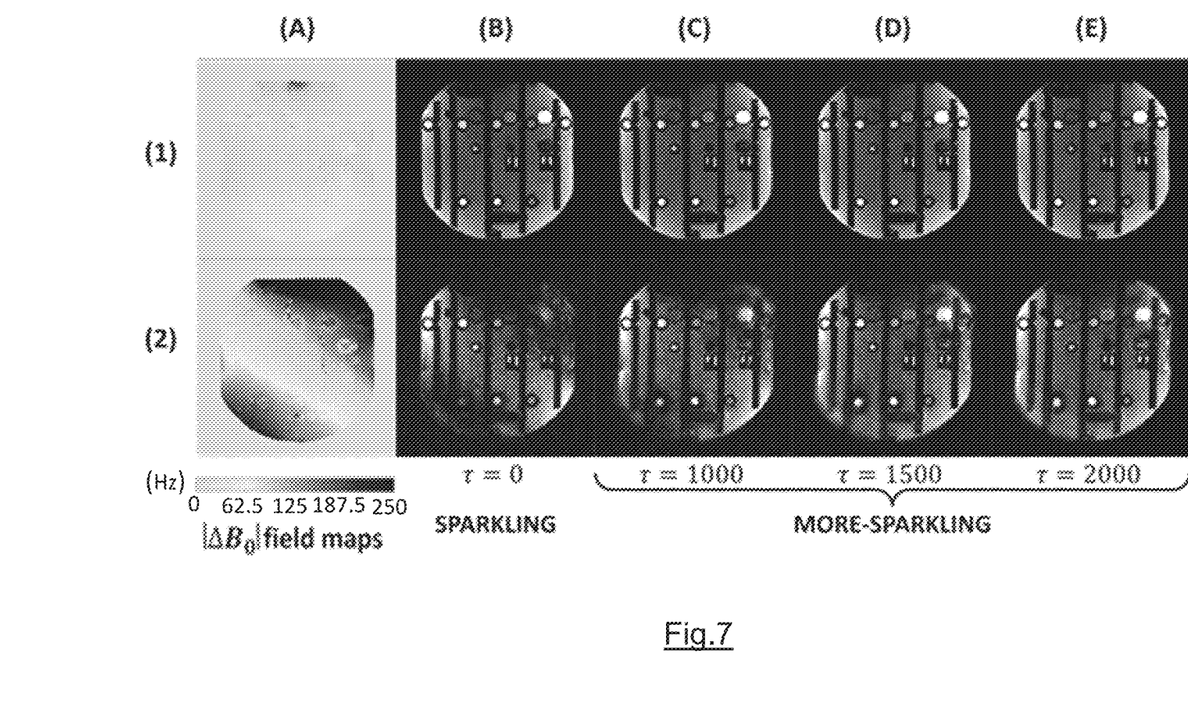
FIGS. 7 and 8 illustrate the technical effect of the invention, namely the reduction in off-resonance artifacts obtained using 3D MORE-SPARKLING k-space trajectories instead of 3D SPARKLING ones.
Figure 8:
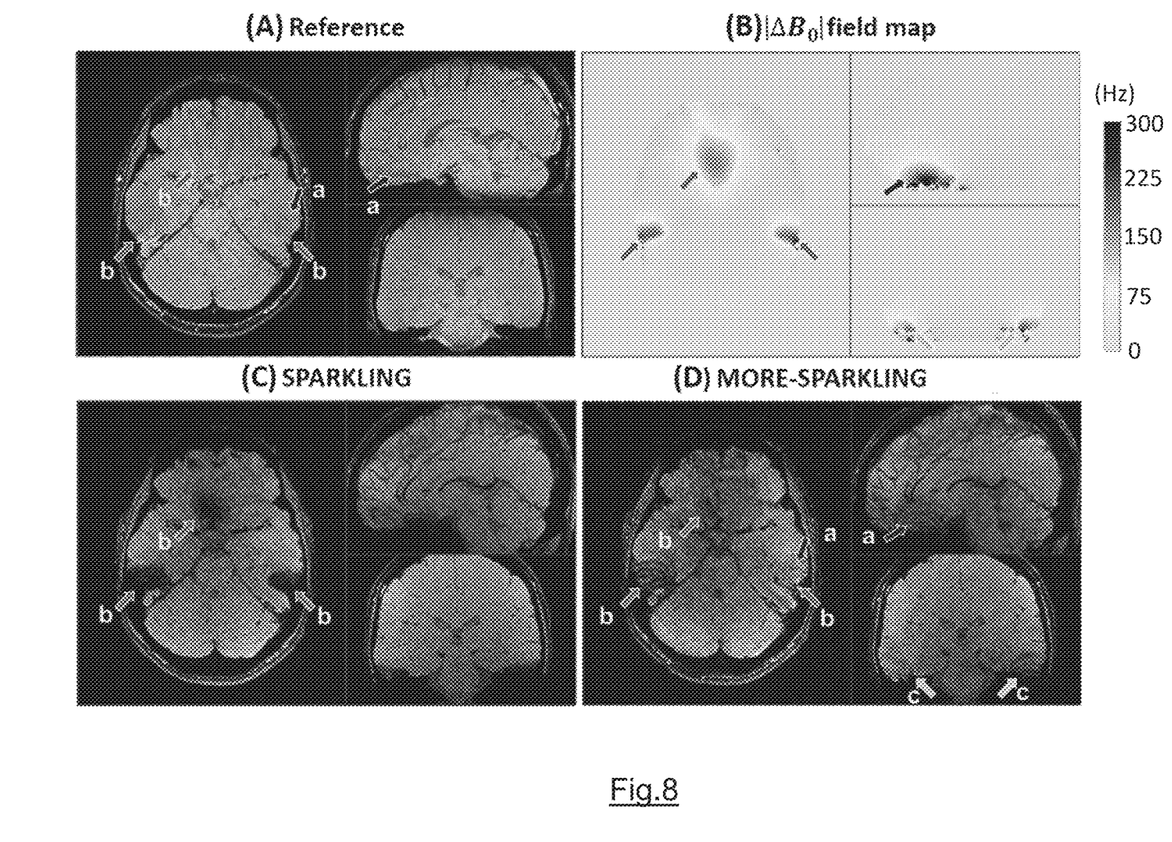

FIGS. 7 and 8 illustrate the technical effect of the invention using a test pattern and the brain of a healthy human volunteer, respectively.

In FIG. 7, lines 1 and 2 correspond to two different magnetic field configurations, represented by the $\Delta B_0$ maps of column E. The images in column A has been acquired using the SPARKLING method. Significant off-resonance artifacts are visible with strong signal losses. Columns (C)-(E) show the results obtained using the inventive MORE-SPARKLING method, at increasing levels of $\tau$ from 1000 to 2000. As the value of $\tau$ increases, the impact of the off-resonance is strongly reduced and most of the lost signal in (A) is recovered.

In FIG. 8, panel B shows axial, sagittal and coronal sections of a 3D $\Delta B_0$ map, where arrows identify the regions of highest inhomogeneity. Panel A shows axial, sagittal and coronal sections of a reference MRI image acquired using a Cartesian sampling scheme, with scan time of 15 minutes and 13 seconds. In this and in the following panels, arrows highlight artifacts, which are identified by the arrows' label: "b" for blurring, "c" for contrast loss and "a" for loss of anatomical details. It can be seen that, even with Cartesian acquisition, magnetic field inhomogeneity leads to localized blurring and the loss of some anatomical details. Panel C corresponds to SPARKLING acquisition with a scan time of 3 minutes and 22 seconds (acceleration by a factor of about 4.5 compared to Cartesian sampling): very strong blurring can be identified. Panel D corresponds to MORE SPARKLING (with $\tau=1000$, temporal weighting function defined by equation 12): it can be seen that the impact of ABo is substantially reduced compared to the case of prior-art SPARKLING, while maintaining the significant acceleration factor compared to the reference Cartesian sampling.

Figure 9:
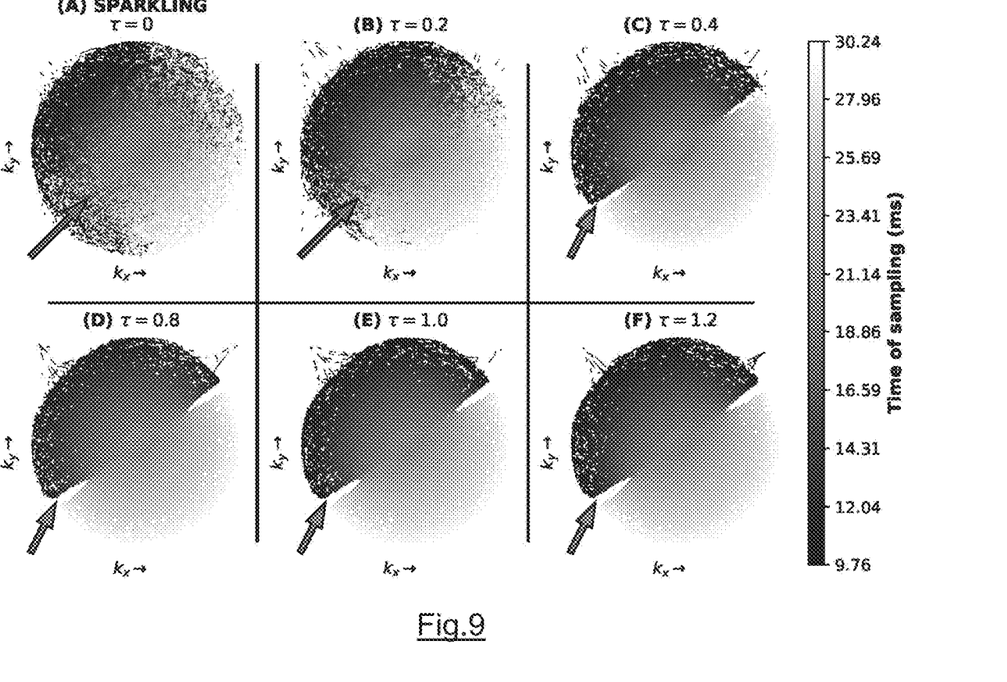
FIG. 9 compares different 3D MORE SPARKLING trajectories with varying temporal weights.

FIG. 9 illustrates SPARKLING/MORE SPARKLING trajectories generated for different values of the temporal weight parameter $\tau$ ($N_c=3639$; $N_s=2048$; weighting function W expressed by equation 13). Panel A correspond to the prior art SPARKLING case, and temporal inhomogeneity is clearly visible. For increasing values of $\tau$ (panel B: $\tau=0.2$; panel C: $\tau=0.4$; panel D: $\tau=0.8$; panel B: $\tau=1.0$; panel B: $\tau=1.2$), temporal homogeneity increases, but gaps in the k-space begin to appear (highlighted b, temporal homogeneity increases, but gaps in the k-space (highligted by arrows) begin to appear. A more detailed analysis shows that increasing $\tau$ beyond a value of 0.8 provides minimal benefits in terms of reduction of off-resonance effects, therefore $\tau \approx 0.8$ is an optimal choice (the exact optimal value depends on the specific setting considered, and on the form of weighting function W).

Figure 10:
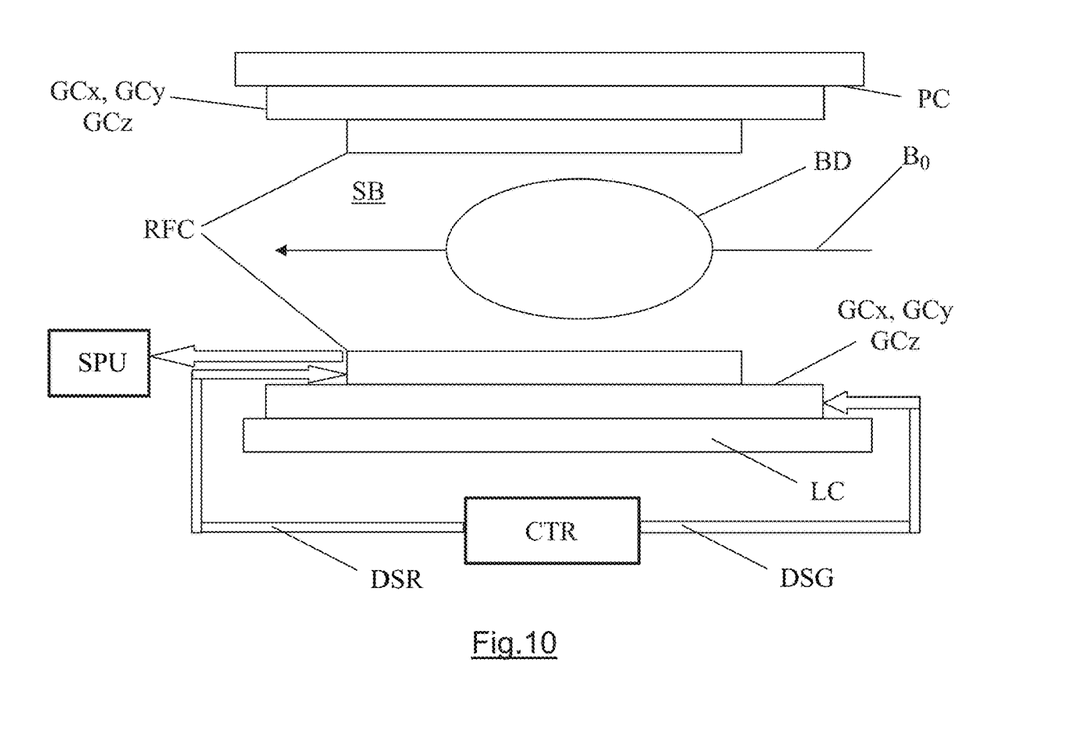
FIG. 10 is a block diagram of a MRI scanner according to an embodiment of the invention.

FIG. 11 illustrates, very schematically, an apparatus for carrying out a method according to the invention. This apparatus is basically a MRI scanner comprising a primary coil PC for generating the longitudinal field $B_0$, a single or preferably a plurality of radio-frequency coils TC for generating RF pulses and receiving the NMR signal (different radio-frequency coils may be used for transmission and reception, or the same coils may serve for both purposes), three gradient coils GCx, GCy and GCz for generating magnetic field gradients $G_x$, $G_y$, $G_z$ along the x, y and z axes respectively (not represented). The gradient coils are disposed around a scanner bore SB in which a body BD to be imaged can be introduced. The term "body" should be construed broadly, designating any living or non-living object containing atomic nuclei at least some of which are supposed to have nonzero spin. For instance, body BD may be a human or animal body or a portion thereof (e.g. a head) or an article of manufacture such as a "phantom". The apparatus also comprises a control unit CTR for driving said gradient coils in and said radio-frequency coil or coils according to a predetermined driving signals (reference DSR for the radio-frequency coils and DSG for the gradient coils) to implement a readout sequence (see e.g. FIG. 1) and a k-space trajectory of the MORE SPARKLING type. The apparatus also comprises a signal processing unit SPU for acquiring NMR signals from the radio-frequency coil or coils and performing image reconstruction. The control unit and the signal processing unit may be separate devices or a single device may implement both functions. Said device or devices may include one or more suitably programmed general purpose computers or digital signal processors, suitably configured specialized digital circuits or both. The signal processing unit also includes a receiving circuit for acquiring NMR signals, comprising a signal amplifier, a sampler and an analog to digital (ADC) converter.

The scanner of FIG. 9 differs from the prior art essentially in that the controlling unit CTR is configured or programmed for driving the gradient coils in such a way that they define a MORE SPARKLING k-space trajectory. For instance, a driving signal DRG defining a MORE SPARKLING trajectory may be stored in a memory of said controlling unit.

The invention has been described with reference to specific examples, but is not limited to them. For instance, the weighting function may have a form different from that of equation (12).

The invention applies to 3D imaging, but also to 2D multislice k-space sampling and to 4D imaging where acceleration can be largely increased.

Trajectory optimization can be initialized starting from any classic k-space filling support (including Cartesian lines, spirals, radial, . . . ), not only radial spokes as in the exemplary embodiments.

The inventive method may be adapted to any types of MR readout scheme segmented or single-shot, from GRE (cf. the detailed examples above), Turbo FLASH (also called MPRAGE for brain applications) to Spin Echo (SE) or Turbo Spin Echo (TSE), TrueFisp (also called bSSFP), EPI.

It may also be adapted to any types of MR sequence weighting T1, T2, T2*, ρ (Spin Density), fMRI (functional MRI) or BOLD MRI, and preparation including none-exhaustively, ASL (Arterial Spin Labelling), DWI (Diffusion weighting imaging) with all its variants (DTI, DSI, IVIM, Kurtosis, NODDI), MTR (Magnetization Transfer Ratio) of any type including CEST, quantitative MRI including simultaneous multiparametric techniques such as Quantitative Susceptibility Mapping (QSM), MRF (MR Fingerprinting), MR Angiography both static or dynamic. This includes more exotic MRI applications such as MR thermometry or Electromagnetic Property Tomography (EPT). It may also be applied to heteronuclear imaging such as Sodium or Phosphorus.

It is compatible with parallel imaging using coil phased array and Simultaneous Multislice technique.

REFERENCES

[Andersson et al. 2003] J. L. R. Andersson, S. Skare, J. Ashburner "How to correct susceptibility distortions in spin-echo echo-planar images: application to diffusion tensor imaging". NeuroImage, 20(2):870-888, 2003.

[Boyer et al, 2016] Boyer, Claire, et al. "On the generation of sampling schemes for magnetic resonance imaging." SIAM Journal on Imaging Sciences 9.4 (2016): 2039-2072.

[Chaithya et al. 2020] Chaithya G R et al. "Optimizing full 3D SPARKLING trajectories for high-resolution T2*-weighted MagneticResonance Imaging. 2020 arXiv preprint arXiv:2108.02991 & IEEE Transactions on Medical Imaging, 2022.

[Chauffert et al. 2016] Chauffert, Nicolas et al. "A projection algorithm for gradient waveforms design" in Magnetic Resonance Imaging. IEEE Transactions on Medical Imaging, Institute of Electrical and Electronics Engineers, 2016, 35 (9), pp.2026-2039.

[Daval-Frerot et al. 2021] Daval-Frérot, Guillaume "Off-resonance correction of non-Cartesian SWI using internal field map estimation" International Society for Magnetic Resonance in Medicine, May 2021, Online, United States.

[Haldar, 2014] Haldar, Justin P. "Low-Rank Modeling of Local k-Space Neighborhoods (LORAKS) for Constrained MRI", IEEE Transactiojn of Medical Imaging 33.3 (2014): 668-680.

[Lazarus et al, 2017] Lazarus, Carole, et al. "SPARKLING: Novel Non-Cartesian Sampling Schemes for Accelerated 2D Anatomical Imaging at 7T Using Compressed Sensing." 25th annual meeting of the International Society for Magnetic Resonance Imaging, Apr 2017, Honolulu, United States.

[Lazarus 2019] Lazarus, Carole et al. "SPARKLING: variable-density k-space filling curves for accelerated T2*-weighted MRI" Magnetic Resonance in Medicine, Wiley, 2019, 81 (6), pp.3643-3661.

[Lustig et al, 2007] Lustig M., Donoho D., Pauly J. M. Sparse MRI: The application of compressed sensing for rapid MR imaging. Magn Reson Med 2007; 58: 1182-1195

[Sutton et al. 2003] Sutton, Bradley P, et al."Iterative Image Reconstruction for MRI in the Presence of Field Inhomogeneities". IEEE Transactions on Medical Imaging 2003;22 (2): 178-88.

The invention claimed is:

1. A method of performing magnetic resonance imaging of a body using a magnetic resonance imaging scanner comprising a scanner bore (SB), a primary coil (PC), radio frequency coils (RFC), gradient coils ($GC_x$, $GC_y$, $GC_z$) and a signal-processing unit (SPU), the method comprising the steps of:
   a. positioning the body (BD) in a scanner bore (SB) where a static and substantially uniform magnetic field ($B_0$), called longitudinal field, oriented along a direction (z), called longitudinal direction, is established by the primary coil (PC);

b. using all or part of the radio-frequency coils (RFC) to transmit to said body at least one radio-frequency pulse (RFP) adapted to excite nuclear spins inside said body;

c. after said or each said radio-frequency pulse, using the gradient coils ($GC_x$, $GC_y$, $GC_z$) to apply to said body a time-varying magnetic field gradient ($G_x$, $G_y$, $G_z$) defining a trajectory (ST) in k-space and simultaneously using all or part of the radio-frequency coils to acquire samples of a magnetic resonance signal emitted by the excited nuclear spin, each sample corresponding to a point (KS) of the k-space belonging to said trajectory; and d. using the signal processing unit (SPU) to apply a nonlinear reconstruction algorithm to the acquired samples to reconstruct a magnetic resonance image of said body;

wherein said trajectory (ST, MT) in k-space is a continuous trajectory complying with a set of constraints including constraints on maximum amplitude and maximum slew rate of said time-varying magnetic field gradient, such that the points (KS) of the k-space corresponding to the samples, called sampling points, define a pseudo-random sampling of the k-space, matching a predetermined target sampling density, said trajectory in k-space minimizing, subject to said set of constraints, a cost function defined by the difference between a first term, called attraction term, promoting consistency of the distribution of sampling points in k-space with said predetermined target sampling density, and a second term, called repulsion term, promoting separation in k-space between sampling points, said repulsion term being expressed as a sum of contributions corresponding to respective pairs of sampling points;

wherein each said contribution is weighted by a weight which increase with temporal separation of the sampling points along said trajectory in k-space.

2. A computer-implemented method of computing a trajectory in k-space to be used for sample acquisition in magnetic resonance imaging, the method comprising the steps of:

i. determining, or receiving from a user input, a number $N_c \geq 1$ of shots constituting the trajectory and a number $N_s > 1$ of sampling points along each said shot;

ii. determining, or receiving from a user input, a predetermined target sampling density;

iii. determining, or receiving from a user input, a set of constraints including constraints on amplitudes of discrete time derivatives of the trajectory;

iv computing said trajectory by minimizing, subject to said set of constraints, a cost function defined by the difference between a first term, called attraction term, promoting consistency of the distribution of sampling points in k-space with said predetermined target sampling density, and a second term, called repulsion term, promoting separation in k-space between sampling points, said repulsion term being expressed as a sum of contributions corresponding to respective pairs of sampling points;

wherein each said contribution is weighted by a weight which increases with temporal separation of the sampling points along said trajectory in k-space.

3. A set of driving signals (DSG) for gradient coils of a magnetic resonance imaging scanner which, when applied to said gradient coils, drive them to generate a time-varying magnetic field gradient ($G_x$, $G_y$, $G_z$) defining a trajectory (ST, MT) in k-space passing through a plurality of points (KS) called sampling points defining a pseudo-random sampling of the k-space, matching a predetermined target sampling density; wherein said trajectory:

is continuous and complies with a set of constraints including constraints on maximum amplitude and maximum slew rate of said time-varying magnetic field gradient;

minimizes, subject to said set of constraints, a cost function defined by the difference between a first term, called attraction term, promoting consistency of the distribution of sampling points in k-space with said predetermined target sampling density, and a second term, called repulsion term, promoting separation in k-space between sampling points, said repulsion term being expressed as a sum of contributions corresponding to respective pairs of sampling points;

wherein each said contribution is weighted by a weight which increases with temporal separation of the sampling points along said trajectory in k-space.

4. A magnetic resonance imaging scanner comprising:

a scanner bore (SB) inside which a body can be positioned;

a primary coil (PC) configured to establish in the scanner bore a static and substantially uniform magnetic field ($B_0$), called longitudinal field, oriented along a direction (z), called longitudinal direction;

radio frequency coils (RFC) configured to transmit to said body at least one radio-frequency pulse (RFP) adapted for exciting nuclear spins inside said body and to acquire samples of a magnetic resonance signal emitted by the excited nuclear spin;

gradient coils ($GC_x$, $GC_y$, $GC_z$) configured to apply to said body a time-varying magnetic field gradient ($G_x$, $G_y$, $G_z$) defining a trajectory (ST, MT) in k-space;

a signal processing unit (SPU) to apply a nonlinear reconstruction algorithm to the acquired samples of the magnetic resonance signal for reconstructing a magnetic resonance image of said body; and a controller (CTR) configured to generate driving signals (DSR) for the radio frequency coils and (DSG) for the gradient coils;

wherein the controller is configured to generate said driving signals for (DSG) for the gradient coils to generate a said time-varying magnetic field gradient ($G_x$, $G_y$, $G_z$) such that said a trajectory (ST) in k-space passes through a plurality of points (KS) called sampling points defining a pseudo-random sampling of the k-space, matching a predetermined target sampling density, said trajectory being continuous and compliant with a set of constraints including constraints on maximum amplitude and maximum slew rate of said time-varying magnetic field gradient, said trajectory in k-space also minimizing, subject to said set of constraints, a cost function defined by the difference between a first term, called attraction term, promoting consistency of the distribution of sampling points in k-space with said predetermined target sampling density, and a second term, called repulsion term, promoting separation in k-space between sampling points, said repulsion term being expressed as a sum of contributions corresponding to respective pairs of sampling points;

and wherein the controller is also configured to generate driving signals (DSR) for the radio frequency coils such that they acquire said samples of a magnetic resonance signal emitted by the excited nuclear spin in correspondence to the sampling points (KS) of the trajectory in k-space;

wherein each said contribution to the repulsion term of the cost function is weighted by a weight which increase with temporal separation of the sampling points along said trajectory in k-space.

5. The method of claim 1, wherein said attraction term is defined by $$F_p^a(K, \Pi) = \underset{K \in Q^{N_c}}{argmin} \frac{1}{p}\sum_{i=1}^{p}\int_{\Omega}\|x - K[i]\Pi(x)dx\|$$

and said repulsion term is defined by $$F_p^r(K) = \frac{1}{2p^2}\sum_{1 \leq i,j \leq p} W(|t_i - t_j|)\|K[i] - K[j]\|$$

where:
K is a two or three dimensional vector representing the coordinates of a sampling point in k-space;
$p = N_c \cdot N_s$ is the number of sampling points along the trajectory, each trajectory being constituted of $N_c \geq 1$ shots each comprising $N_s > 1$ sampling points;
$Q^{Nc}$ is a set of curves in k-space comprising $N_c$ segments of $N_S$ points each and complying with said constraints;
$\Omega$ is a sampling region in k-space;
x represents a generic point of the sampling region $\Omega$;
π is said predetermined target sampling density;
$\|\cdot\|$ is a norm;
$t_i$, $t_j$ are the times at which two sampling points of a same shot, identified by integer indices i and j, are reached; and
W is a monotonously increasing function of $|t_i-t_j|$ expressing said weight.

6. The method of claim 1, wherein said set of constraints further comprises at least one linear constraint on the trajectory.

7. The method of claim 1, further comprising a preliminary step of computing said trajectory (ST) in k-space.

8. The method of claim 2, wherein said attraction term is defined by $$F_p^a(K, \Pi) = \underset{K \in Q^{N_c}}{argmin} \frac{1}{p}\sum_{i=1}^{p}\int_{\Omega}\|x - K[i]\Pi(x)dx\|$$

and said repulsion term is defined by $$F_p^r(K) = \frac{1}{2p^2}\sum_{1 \leq i,j \leq p} W(|t_i - t_j|)\|K[i] - K[j]\|$$

where:
K is a two or three dimensional vector representing the coordinates of a sampling point in k-space;
$p = N_c \cdot N_s$ is the number of sampling points along the trajectory;
$Q^{Nc}$ is a set of curves in k-space comprising $N_c$ segments of $N_s$ points each and complying with said constraints;
$\Omega$ is a normalized sampling region in k-space;
x represents a generic point of the sampling region $\Omega$;
π is said predetermined target sampling density;
$\|\cdot\|$ is a norm;
$t_i$, $t_j$ are the times at which two sampling points of a same shot, identified by integer indices i and j, are reached; and
W is a monotonously increasing function of $|t_i-t_j|$ expressing said weight.

9. The method of claim 2, wherein said set of constraints further comprises at least one linear constraint on the trajectory.

10. A computer program comprising instructions which, when the program is executed by a computer, cause the computer to carry out the method of claim 2.

11. The method of claim 5, wherein norm $\|\cdot\|$ is the $L_2$ norm.

12. The method of claim 5, wherein W is an exponential function of $|t_i-t_j|$.

13. The method of claim 8, wherein norm $\|\cdot\|$ is the $L_2$ norm.

14. The method of claim 8, wherein W is an exponential function of $|t_i-t_j|$.

15. The method of claim 14, wherein step iv. is performed through multi-resolution iterations with a decreasing decimation level R, W being a decreasing function of R.

* * * * *

UNITED STATES PATENT AND TRADEMARK OFFICE
CERTIFICATE OF CORRECTION

| | | |
|---|---|---|
| PATENT NO. | : 12,345,785 B2 | Page 1 of 1 |
| APPLICATION NO. | : 18/137840 | |
| DATED | : July 1, 2025 | |
| INVENTOR(S) | : Chaithya Giliyar Radhakrishna et al. | |

It is certified that error appears in the above-identified patent and that said Letters Patent is hereby corrected as shown below:

In the Claims

In Claim 14, Column 18, Line 42 "exponential function of | ti – tj." should be -- exponential function of | ti – tj| . --.

Signed and Sealed this
Fourteenth Day of October, 2025

John A. Squires
*Director of the United States Patent and Trademark Office*